United States Patent
Lu et al.

(10) Patent No.: US 11,316,131 B2
(45) Date of Patent: Apr. 26, 2022

(54) OLED DISPLAY PANEL HAVING MULTI-GROOVE RETAINING WALLS

(71) Applicant: Wuhan China Star Optoelectronics Semiconductor Display Technology Co., Ltd., Hubei (CN)

(72) Inventors: Rui Lu, Wuhan (CN); Jun Cao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 236 days.

(21) Appl. No.: 16/631,892

(22) PCT Filed: Sep. 23, 2019

(86) PCT No.: PCT/CN2019/107302
§ 371 (c)(1),
(2) Date: Jan. 17, 2020

(87) PCT Pub. No.: WO2021/022638
PCT Pub. Date: Feb. 11, 2021

(65) Prior Publication Data
US 2021/0408458 A1      Dec. 30, 2021

(30) Foreign Application Priority Data
Aug. 6, 2019      (CN) .......................... 201910719810.5

(51) Int. Cl.
*H01L 51/52* (2006.01)
*H01L 23/00* (2006.01)

(52) U.S. Cl.
CPC ........ *H01L 51/5253* (2013.01); *H01L 23/564* (2013.01); *H01L 2251/301* (2013.01)

(58) Field of Classification Search
CPC ........... H01L 51/5253; H01L 2251/301; H01L 23/564; G02F 2001/133357
See application file for complete search history.

(56) References Cited

U.S. PATENT DOCUMENTS

| | | | | |
|---|---|---|---|---|
| 9,923,167 B2* | 3/2018 | Choi | ................ | H01L 51/5253 |
| 9,947,731 B2* | 4/2018 | Jiao | .................. | H01L 27/3246 |
| 10,263,214 B2* | 4/2019 | Riegel | .............. | H01L 51/5253 |
| 2005/0133802 A1* | 6/2005 | Lee | .................. | H01L 27/3246 |
| | | | | 257/95 |
| 2007/0157839 A1* | 7/2007 | Kim | .................. | H01J 9/2278 |
| | | | | 101/483 |

(Continued)

FOREIGN PATENT DOCUMENTS

| CN | 104133327 A | 11/2014 |
|---|---|---|
| CN | 108832016 A | 11/2018 |

(Continued)

*Primary Examiner* — Ida M Soward
(74) *Attorney, Agent, or Firm* — Luedeka Neely Group, P.C.; Rick Barnes

(57) ABSTRACT

An organic light-emitting diode (OLED) display panel includes a substrate including a display area and a non-display area. At least a retaining wall is disposed on the non-display area and is configured to protrude outward from a surface of the substrate. A plurality of first grooves are provided on the retaining wall. The first grooves are arranged in at least two rows, and the first grooves in adjacent two of the rows are alternately arranged.

18 Claims, 5 Drawing Sheets

(56) References Cited

U.S. PATENT DOCUMENTS

| | | | |
|---|---|---|---|
| 2013/0099221 A1* | 4/2013 | Kawamura | H01L 51/52 438/34 |
| 2015/0171367 A1* | 6/2015 | Moon | H01L 51/5253 257/40 |
| 2015/0380685 A1* | 12/2015 | Lee | H01L 51/5243 257/40 |
| 2016/0252762 A1 | 9/2016 | Huang et al. | |
| 2017/0090227 A1* | 3/2017 | Yun | G02F 1/1368 |
| 2020/0075700 A1 | 3/2020 | Cao et al. | |
| 2020/0081301 A1 | 3/2020 | Yang | |
| 2020/0274094 A1* | 8/2020 | Zheng | H01L 51/56 |
| 2020/0335577 A1* | 10/2020 | Park | H01L 51/0097 |
| 2021/0083223 A1 | 3/2021 | Guo | |

FOREIGN PATENT DOCUMENTS

| | | | |
|---|---|---|---|
| CN | 108832022 A | | 11/2018 |
| CN | 109001949 A | | 12/2018 |
| CN | 109244261 A | | 1/2019 |
| CN | 109300910 A | | 2/2019 |
| CN | 109461832 A | * | 3/2019 |

* cited by examiner

OLED DISPLAY PANEL HAVING MULTI-GROOVE RETAINING WALLS

BACKGROUND OF INVENTION

1. Field of Invention

The present invention relates to a technical field of displays, and particularly to, an organic light-emitting diode (OLED) display panel.

2. Related Art

With development of display technology, flexible display devices have been widely increasingly used due to their advantages of being light in weight, thin thickness, bendable, and wide viewing angles. A material of organic light-emitting diode (OLED) device 201 is sensitive to water and oxygen, and a small amount of water and oxygen intrusion can immediately result in rapid decay and aging of the device, thereby adversely affecting service life of the OLED device. Therefore, encapsulation technology is relatively important to ensure maintenance of service life of display devices.

A conventional OLED thin film encapsulation (TFE) layer 300 is configured with organic/inorganic film layers provided in a stacked arrangement to achieve an object of blocking moisture and oxygen intrusion. Inorganic film layers are mainly used to block moisture and oxygen, and organic film layers are mainly used to encapsulate particles and buffer and release stress, and so on. Currently, regarding preparation of organic film layers in the thin film encapsulation, it is generally performed by plasma enhanced chemical vapor deposition (PECVD), atomic layer deposition (ALD), inkjet printing (IJP), and other methods. As shown in FIG. 2 (a), an OLED display panel includes a display area 10 and a non-display area 20 surrounding the display area 10. As shown in FIG. 1, the thin film encapsulation layer 300 includes a first inorganic layer 301, at least a first organic layer 302, and a second inorganic layer 303. In order to prevent an organic film from overflowing into a coverage area of an inorganic film, at least a barrier wall 1 is generally provided in the non-display area 20, and the first inorganic layer 301 and the second inorganic layer 303 are formed on the barrier wall 1 by chemical vapor deposition (CVD), while the first organic layer 302 is fabricated by inkjet printing (IJP).

In a practical organic film layer deposition process, it is difficult to ensure that the organic film can be leveled from the display area 10 to the non-display area 20. Since a flow velocity of an organic liquid from the display area 10 to the non-display area 20 becomes slow, the organic film layer of the non-display area 20 is caused to be thinned, and a capability to encapsulate the particles is lost. As shown in FIGS. 2(a) and 2(b), segment A with respect to a horizontal axis of FIG. 2(b) indicates the display area 10, segment B with respect to the horizontal axis indicates the non-display area 20, a vertical axis indicates a thickness of the organic film, and C indicates that the organic film is too thin. When an organic liquid is leveled in the non-display area 20 and thickness of the organic film layer as desired is ensured that are all fulfilled, it is very easy to give rise to the organic film to be formed in excess of the barrier wall, resulting in a problem of overflowing of the organic liquid.

SUMMARY OF INVENTION

An object of the present invention is to provide an organic light-emitting diode (OLED) display panel including at least a first groove disposed on a retaining wall. The first groove is configured to ensure that a film thickness resulting from an organic liquid flowing to a non-display area is not too thin, thereby improving a leveling effect of an organic film in an encapsulation structure, and overcoming problems of overflowing liquid, thin edges of an organic film, and incapability of effectively encapsulating particles.

In order to achieve the above-mentioned object, the present application provides following technical solutions.

The present application provides an organic light-emitting diode (OLED) display panel, comprising a substrate comprising a display area and a non-display area; at least a retaining wall disposed on the non-display area and configured to protrude outward from a surface of the substrate; wherein a plurality of first grooves are provided on the retaining wall, the first grooves are arranged in at least two rows, the first grooves in adjacent two of the rows are alternately arranged, and the first grooves have a depth the same as each other or different from each other.

Further, each of the first grooves has a length between 10 microns (μm) and 60 μm, and a width between 4 μm and 10 μm, wherein a pitch between adjacent two of the first grooves is between 4 μm and 10 μm.

Further, the first grooves have a depth less than or equal to a height of the retaining wall protruding outward from the surface of the substrate.

Further, at least one of the first grooves has a depth greater than a height of the retaining wall protruding outward from the surface of the substrate.

Further, the first grooves are rectangular, trapezoidal, or V-like in shape in a horizontal cross section.

Further, a number of the retaining wall is at least two.

Further, the retaining wall is made of an organic material.

Further, the OLED display panel further comprises a thin film encapsulation layer, wherein the thin film encapsulation layer comprises a first inorganic layer, an organic layer, and a second inorganic layer all sequentially disposed.

The present invention further provides an organic light-emitting diode (OLED) display panel, comprising a substrate comprising a display area and a non-display area; at least a retaining wall disposed on the non-display area and configured to protrude outward from a surface of the substrate; wherein a plurality of first grooves are provided on the retaining wall.

Further, the first grooves are arranged in at least two rows, and the first grooves in adjacent two of the rows are alternately arranged.

Further, each of the first grooves has a length between 10 μm and 60 μm, and a width between 4 μm and 10 μm, wherein a pitch between adjacent two of the first grooves is between 4 μm and 10 μm.

Further, the first grooves have a depth the same as each other or different from each other.

Further, the first grooves have a depth less than or equal to a height of the retaining wall protruding outward from the surface of the substrate.

Further, at least one of the first grooves has a depth greater than a height of the retaining wall protruding outward from the surface of the substrate.

Further, the first grooves are rectangular, trapezoidal, or V-like in shape in a horizontal cross section.

Further, a number of the retaining wall is at least two.

Further, the retaining wall is made of an organic material.

Further, the thin film encapsulation layer comprises a first inorganic layer, an organic layer, and a second inorganic layer all sequentially disposed.

The present invention has advantages as follows: using a plurality of grooves formed on at least a retaining wall, and the first grooves in adjacent two of the rows are alternately arranged to improve a leveling effect of an organic film of an organic layer of the thin film encapsulation layer, and therefore to overcome problems of overflowing of an organic liquid of the organic layer, thin edges of the organic film, and incapability of effectively encapsulating particles.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
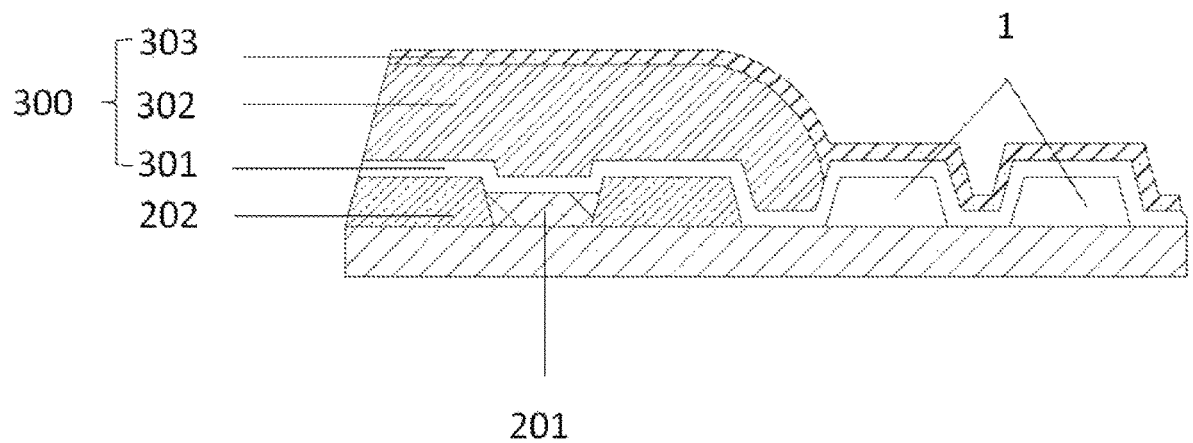
FIG. 1 is a schematic structural view of a conventional organic light-emitting diode (OLED) display panel.
Figure 2A:
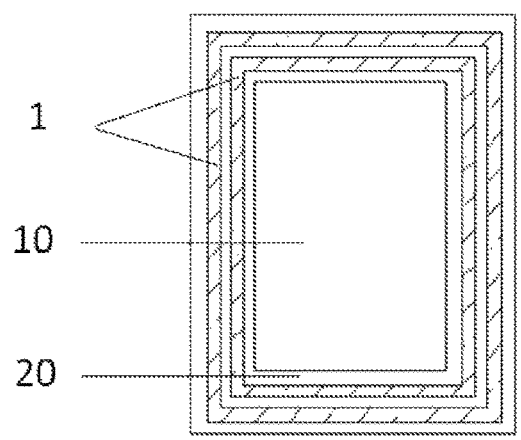
FIG. 2(a) is a top plan view of a conventional OLED display panel.
Figure 2B:
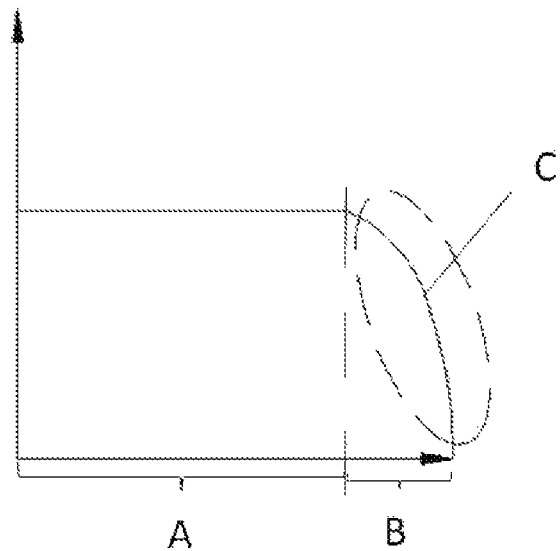
FIG. 2(b) is a schematic view showing thickness of a conventional organic layer.

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments obtained by those skilled in the art without creative efforts shall be within the scope of the present application.

The terms "first", "second", "third", etc. (if present) in the specification and claims of the present invention and the above figures are used to distinguish similar objects, and are not necessarily used to describe a specific order or priority. It should be understood that the objects so described are interchangeable where appropriate. Moreover, the terms "comprise" and "has" and any variations thereof are intended to cover a non-exclusive inclusion.

The drawings discussed below and the various embodiments used to describe the principles of the present invention are intended to be illustrative only and not to limit the scope of the invention. Those skilled in the art will appreciate that the principles of the present invention can be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings denote the same elements.

The terms used in the description of the present invention are intended to describe a particular embodiment, and are not intended to illustrate the concept of the invention. Expressions used in the singular encompass the plural form of expression unless the context clearly dictates otherwise. In the description of the present invention, it is to be understood that the terms such as "include", "have", and "include" are intended to describe the possibility of one or more other features, numbers, steps, actions, or combinations disclosed in the present invention, and are not intended to exclude the possibility that one or more other features, numbers, steps, acts, or combinations thereof may be added. The same reference numerals in the drawings denote the same parts.

Figures 3A, 3B, 3C:
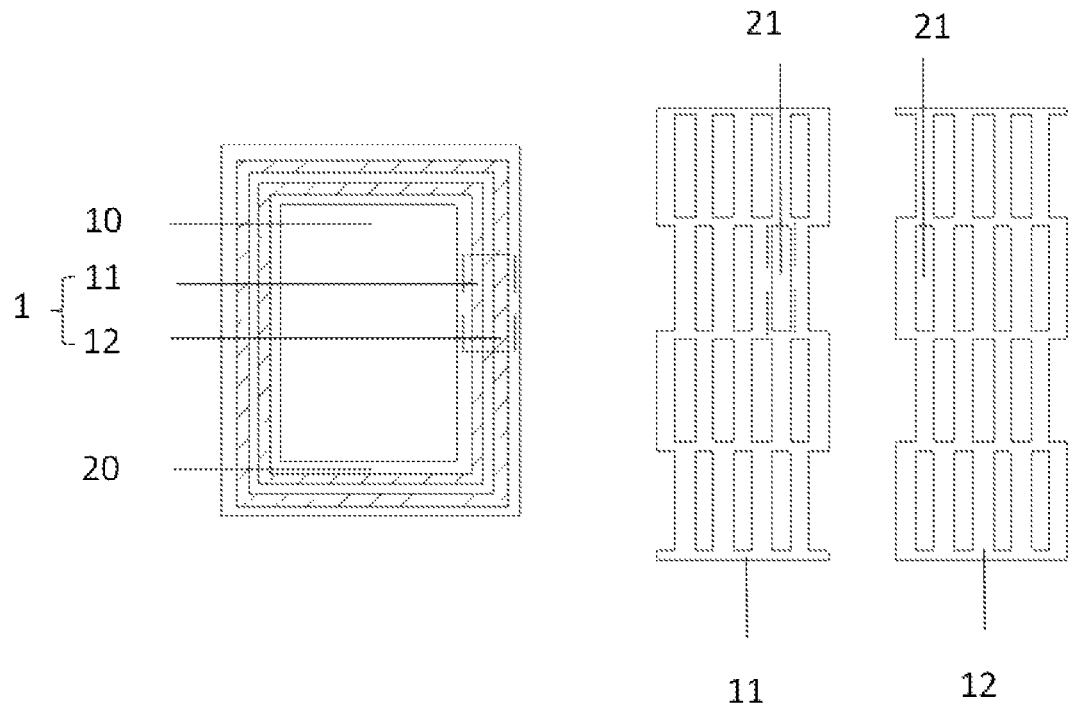
FIG. 3(a) is a top plan view of an organic light-emitting diode (OLED) display panel of the present application.
FIGS. 3(b) and 3(c) are top plan views of a plurality of first grooves formed on a retaining wall of the present application.

Please refer to FIGS. 3(a), 3(b) and 3(c). FIG. 3(a) is a top plan view of an organic light-emitting diode (OLED) display panel of the present application. FIGS. 3(b) and 3(c) are top plan views of a plurality of first grooves formed on a retaining wall of the present application. The OLED display panel includes a substrate 100. The substrate 100 includes a display area 10, a non-display area 20 surrounding the display area 10, at least a retaining wall 1 is disposed on the non-display area 20. The retaining wall 1 is configured to completely surround the display area 10 and protrudes outward from a surface of the substrate 100. At least one of a plurality of the retaining walls 1 is provided with a plurality of first grooves 21. The first grooves 21 are arranged in at least two rows, and the first grooves 21 in adjacent two of the rows are alternately arranged. Each of the first grooves 21 has a length between 10 microns ($\mu$m) and 60 $\mu$m, and a width between 4 $\mu$m and 10 $\mu$m, wherein a pitch between adjacent two of the first grooves 21 is between 4 $\mu$m and 10 $\mu$m. The first grooves 21 have a depth the same as each other or different from each other. The first grooves 21 are small enough to form a plurality of capillary channels.

As shown in FIG. 1, in the display area 10, the OLED display panel includes an OLED device layer 200 and a thin film encapsulation layer 300. The OLED device layer 200 is disposed on the substrate 100 and includes at least an OLED device 201, a pixel definition layer, and a planarization layer 202. The thin film encapsulation layer 300 includes a first inorganic layer 301, an organic layer 302, and a second inorganic layer 303 all sequentially disposed. In the non-display area 20, the thin film encapsulation layer 300 covers the retaining wall 1. The retaining wall 1 is configured to block an organic encapsulation liquid of the organic layer 302 of the thin film encapsulation layer 300 from overflowing when the OLED device layer 200 is encapsulated by the thin film encapsulation layer 300.

Figure 4A:
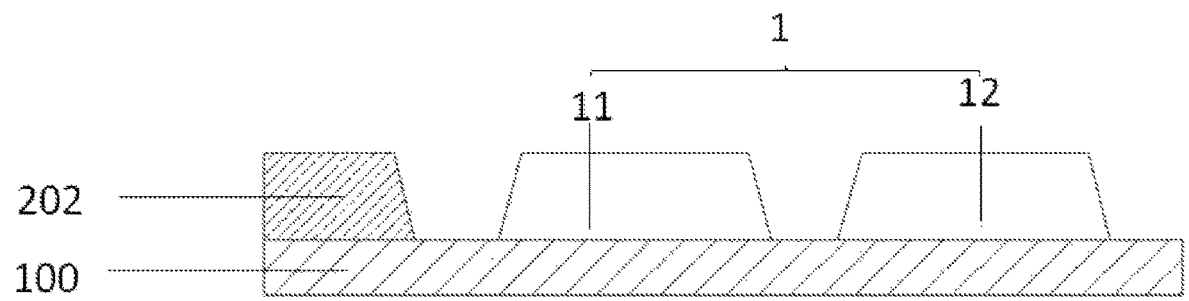
FIGS. 4(a) and 4(b) are cross-sectional views of a plurality of first grooves formed on a retaining wall of a first embodiment of the present application.
Figure 4B:
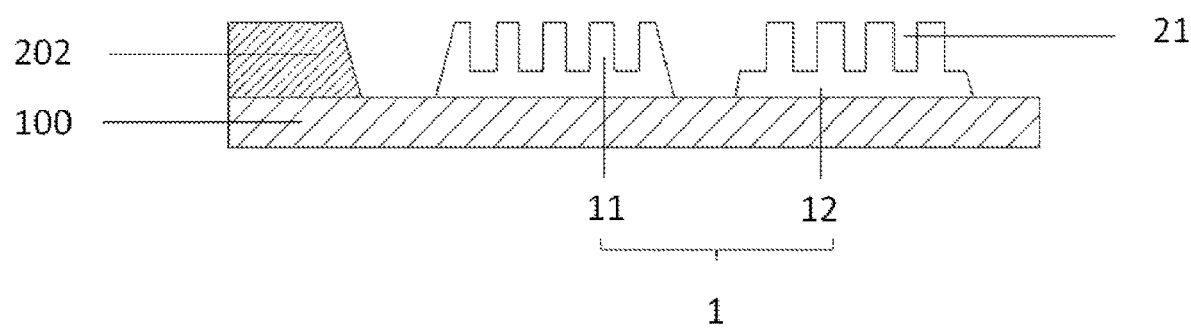

Please refer to FIGS. 4(a) and 4(b). FIGS. 4(a) and 4(b) are cross-sectional views of a plurality of first grooves formed on a retaining wall of a first embodiment of the present application. The substrate 100 includes a polyimide (PI) substrate and a driver circuit. The retaining wall 1 is disposed on the substrate 100 and is configured to block an organic encapsulation liquid from overflowing when encapsulating the OLED device 201. A number of the retaining wall 1 is not limited to one, and may be two or more than two. The retaining wall 1 is made of an organic material and has a height the same as another retaining wall 1. The retaining wall 1 is fabricated by a mask the same as the pixel definition layer and the planarization layer 202, and is fabricated by exposure, development, and the like, wherein the retaining wall 1 is made of polyparaphenylene. There are two retaining walls 1 in the first embodiment of the present application. The retaining wall 1 includes a first retaining wall 11 and a second retaining wall 12. The first retaining wall 11 and the second retaining wall 12 are each annular retaining walls.

In the first embodiment of the present application, a plurality of rows of the first grooves 21 are arranged in parallel with each other on a top of the retaining wall 1, and the first grooves 21 in adjacent two of the rows are alternately arranged. The first grooves 21 have a depth less than or equal to a height of the retaining wall 1 protruding outward from the surface of the substrate 100, and each of the first grooves 21 has a same depth. The first grooves 21 are rectangular, trapezoidal, or V-like in shape in a horizontal cross section. The first grooves 21 can be formed by using an imprinting, exposure, or development method. Formation of different shapes of the first grooves 21 depends on selection of an imprinting fixture or a development process. Number of the first grooves 21 may be optimized according to actual width and length of the retaining wall 1, for example, in a direction extending from the display area 10 to the non-display area 20, number of the first grooves 21 of the first retaining wall 11 and the second retaining wall 12 may be different.

Figure 5:
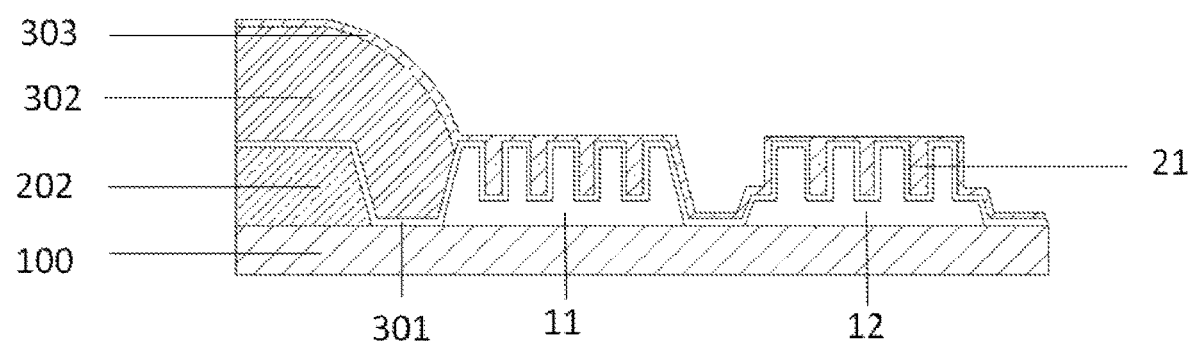
FIG. 5 is a schematic encapsulation view of the OLED of the first embodiment of the present application.

Please refer to FIG. 5. FIG. 5 is a schematic encapsulation view of the OLED of the first embodiment of the present application. After deposition of the OLED device layer 200 in the display area 10, and preparation of the retaining wall 1 in the non-display area 20 are completed, the thin film encapsulation layer 300 is fabricated on the pixel definition layer and the planarization layer 202 and the retaining wall 1. The retaining wall 1, the OLED device 201, the pixel definition layer, and the planarization layer 202 are covered by the thin film encapsulation layer 300. The thin film encapsulation layer 300 includes a first inorganic layer 301, an organic layer 302, and a second inorganic layer 303. The first inorganic layer 301 and the second inorganic layer 303 are film layers capable of blocking moisture and oxygen intrusion and may be made of silicon nitride (SiNx), silicon oxide (SiOx), silicon oxynitride (SiOxNy), aluminum oxide (AlOx), hafnium oxide (HfOx), titanium oxide (TiOx), and may be fabricated by chemical vapor deposition (CVD), atomic layer deposition (ALD), pulsed laser deposition (PLD) techniques, etc. The organic layer 302 may be made of acrylate, epoxy resin, hexamethyldisiloxane (HMDSO), a novel aluminum-based organic-inorganic composite film (Alucone), polyphenylene, etc., and may be fabricated by inkjet printing (IJP), sealer/dispenser, chemical vapor deposition (CVD) techniques, etc. In the first embodiment of the present application, the first inorganic layer 301 and the second inorganic layer 303 are each fabricated by chemical vapor deposition (CVD), and the organic layer 302 is fabricated by an inkjet printing (IJP) method.

Figure 6:
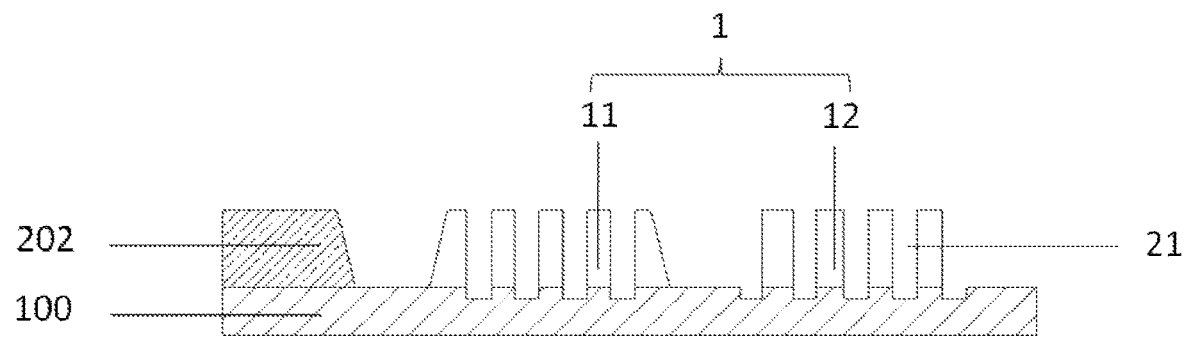
FIG. 6 is a cross-sectional view of a plurality of first grooves formed on a retaining wall of a second embodiment of the present application.
Figure 7:
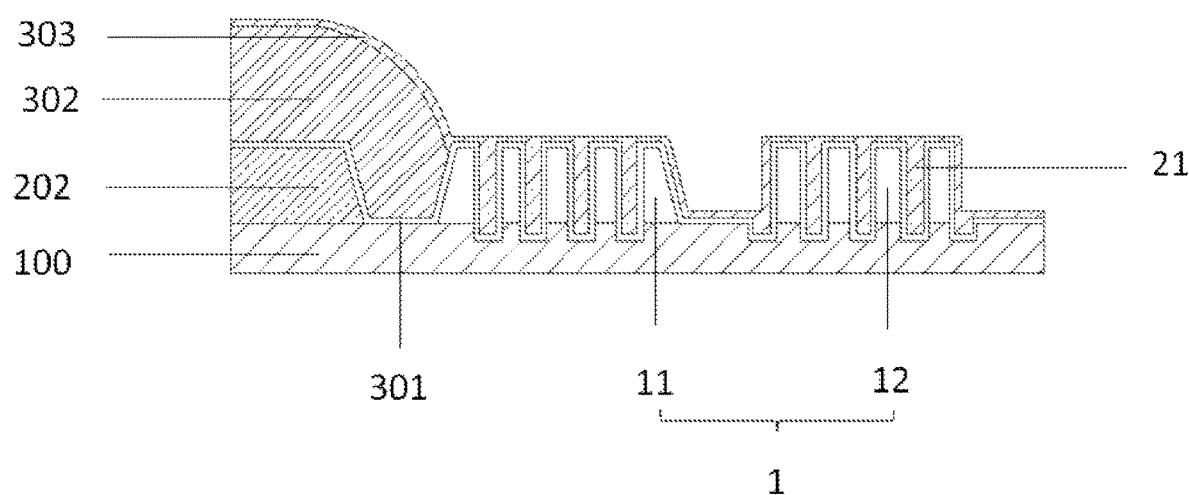
FIG. 7 is a schematic encapsulation view of the OLED of the second embodiment of the present application.

Please refer to FIGS. 6 and 7. FIG. 6 is a cross-sectional view of a plurality of first grooves formed on a retaining wall of a second embodiment of the present application. FIG. 7 is a schematic encapsulation view of the OLED of the second embodiment of the present application. The second embodiment of the present application is different from the first embodiment of the present application in that at least one of the first grooves 21 has a depth greater than a height of the retaining wall 1 protruding outward from the surface of the substrate 100, that is, the one of the first grooves 21 penetrates the retaining wall 1, and a bottom of the one of the first grooves 21 extends to certain film layers of the substrate 100, wherein the certain film layers may be metal layers or inorganic layers of the substrate 100, and each of the first grooves 21 has a same depth. The retaining wall 1 and the first grooves 21 of the substrate 100 can more effectively prevent an organic liquid of the organic layer 302 of the thin film encapsulation 300 from overflowing, thereby further improving performance on encapsulating particles in the non-display area 20.

Furthermore, in the second embodiment, number of the first grooves 21 may be optimized according to actual width and length of the retaining wall 1. In a direction extending from the display area 10 to the non-display area 20, number of the first grooves 21 of the first retaining wall 11 and the second retaining wall 12 may be different.

Of particular note is that the second embodiment of the present application is different from the first embodiment in that if the first grooves 21 are formed on the retaining wall 1 through a process of exposure and development, because the retaining wall 1 and the substrate 100 in the second embodiment are disposed on different layers, and bottoms of the first grooves 21 may extend to different film layers of the substrate 100, for example, metal layers or inorganic layers of the substrate 100, it is thus necessary to replace different developing solutions for different layers of the retaining wall 1 and the substrate 100, so that the first grooves 21 can be etched to have a better shape as desired. However, in the second embodiment of the present application, the first grooves 21 are fabricated using an imprinting method, and therefore there is no need to take into account the problem caused by using exposure and development processes.

Figure 8A:
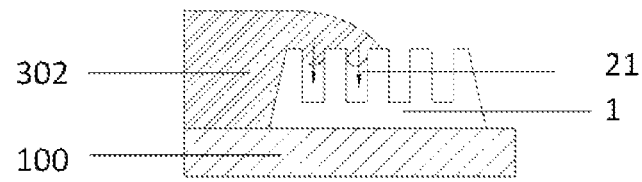
FIGS. 8(a) and 8(b) are schematic views showing flowing of an organic liquid on a retaining wall of the present application (an inorganic layer of a thin film encapsulation (TFE) is omitted).
Figure 8B:
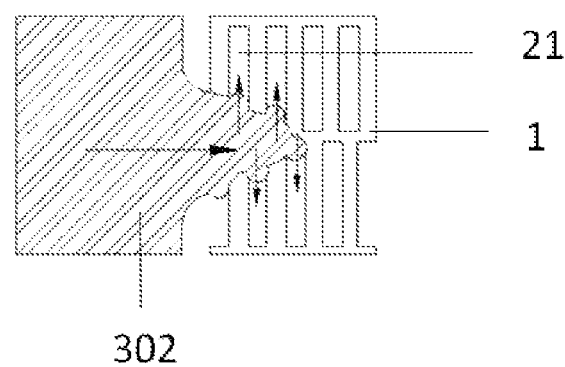

Please refer to FIGS. 8(a) and 8(b). FIGS. 8(a) and 8(b) are schematic views showing flowing of an organic liquid on a retaining wall of the present application (an inorganic layer of a thin film encapsulation (TFE) is omitted). When an organic liquid of the organic layer 302 flows over the retaining wall 1, thickness of film layers in the non-display area 20 as desired is ensured, so that particles can be effectively encapsulated and thus improve encapsulation performance. In this manner, during a process that the organic liquid of the organic layer 302 on the retaining wall 1 gradually spreads from the display area 10 to the non-display area 20, the organic liquid flows to tops and opposite ends of the first grooves 21 and therefore prevent a situation that the organic liquid of the organic layer 302 spreads over outermost edges of the retaining wall 1, thereby to effectively overcome a problem of overflowing of the organic liquid.

Accordingly, based on the OLED display panel of the first embodiment and the second embodiment of the present application, a leveling effect of an organic film of the organic layer 302 in an encapsulation structure can be improved by altering shapes and patterns of the retaining wall 1 or the substrate 100. That is, using an imprinting, exposure, or development method to form the first grooves 21 arranged in at least two rows on a top of the retaining wall 1, the first grooves 21 in adjacent two of the rows alternately arranged, and a capillary effect of the first grooves 21 to mitigate the problem of overflowing of the organic liquid of the organic layer 302 in the thin film encapsulation layer 300, thereby ensuring thickness of an organic film layer in the non-display area 20 as desired, and effectively improving performance on encapsulating particles.

The subject matter of the present application is feasible to be manufactured and used in the industry, and thus has the industrial applicability.

What is claimed is:

1. An organic light-emitting diode (OLED) display panel, comprising:
 a substrate comprising a display area and a non-display area; and
 at least a retaining wall disposed on the non-display area and configured to protrude outward from a surface of the substrate;
  wherein a plurality of first grooves are provided on the retaining wall, the first grooves are arranged in at least two rows, the first grooves in adjacent two of the rows are alternately arranged, and the first grooves have a depth the same as each other or different from each other.

2. The OLED display panel of claim 1, wherein each of the first grooves has a length between 10 microns ($\mu$m) and 60 $\mu$m, and a width between 4 $\mu$m and 10 $\mu$m, wherein a pitch between adjacent two of the first grooves is between 4 $\mu$m and 10 $\mu$m.

3. The OLED display panel of claim 1, wherein the first grooves have a depth less than or equal to a height of the retaining wall protruding outward from the surface of the substrate.

4. The OLED display panel of claim 1, wherein at least one of the first grooves has a depth greater than a height of the retaining wall protruding outward from the surface of the substrate.

5. The OLED display panel of claim 1, wherein the first grooves are rectangular, trapezoidal, or V-like in shape in a horizontal cross section.

6. The OLED display panel of claim 1, wherein a number of the retaining wall is at least two.

7. The OLED display panel of claim 1, wherein the retaining wall is made of an organic material.

8. The OLED display panel of claim 1, further comprising a thin film encapsulation layer, wherein the thin film encapsulation layer comprises a first inorganic layer, an organic layer, and a second inorganic layer all sequentially disposed.

9. An organic light-emitting diode (OLED) display panel, comprising:
 a substrate comprising a display area and a non-display area; and
 at least a retaining wall disposed on the non-display area and configured to protrude outward from a surface of the substrate;
  wherein a plurality of first grooves are provided on the retaining wall.

10. The OLED display panel of claim 9, wherein the first grooves are arranged in at least two rows, and the first grooves in adjacent two of the rows are alternately arranged.

11. The OLED display panel of claim 10, wherein each of the first grooves has a length between 10 $\mu$m and 60 $\mu$m, and a width between 4 $\mu$m and 10 $\mu$m, wherein a pitch between adjacent two of the first grooves is between 4 $\mu$m and 10 $\mu$m.

12. The OLED display panel of claim 9, wherein the first grooves have a depth the same as each other or different from each other.

13. The OLED display panel of claim 12, wherein the first grooves have a depth less than or equal to a height of the retaining wall protruding outward from the surface of the substrate.

14. The OLED display panel of claim 12, wherein at least one of the first grooves has a depth greater than a height of the retaining wall protruding outward from the surface of the substrate.

15. The OLED display panel of claim 9, wherein the first grooves are rectangular, trapezoidal, or V-like in shape in a horizontal cross section.

16. The OLED display panel of claim 9, wherein a number of the retaining wall is at least two.

17. The OLED display panel of claim 9, wherein the retaining wall is made of an organic material.

18. The OLED display panel of claim 9, further comprising a thin film encapsulation layer, wherein the thin film encapsulation layer comprises a first inorganic layer, an organic layer, and a second inorganic layer all sequentially disposed.

* * * * *